United States Patent

Shelby

[15] 3,699,359

[45] Oct. 17, 1972

[54] ELECTRONIC LATCHING DEVICE

[72] Inventor: Rufus F. Shelby, Philadelphia, Pa.

[73] Assignee: Philco-Ford Corporation, Philadelphia, Pa.

[22] Filed: April 20, 1971

[21] Appl. No.: 135,544

[52] U.S. Cl.................307/252 K, 307/288, 307/292, 307/308, 325/465, 334/7

[51] Int. Cl...........................................H03k 17/00

[58] Field of Search......307/221, 252 K, 252 Q, 305, 307/288, 292, 255, 308; 334/7; 325/465

[56] References Cited

UNITED STATES PATENTS

| | | | |
|---|---|---|---|
| 3,564,282 | 2/1971 | Volelsberg | 307/221 B |
| 3,274,555 | 9/1966 | Luke | 307/221 B |

FOREIGN PATENTS OR APPLICATIONS

| | | | |
|---|---|---|---|
| 1,908,533 | 2/1969 | Germany | 307/221 B |

OTHER PUBLICATIONS

Solid State Design Application Note, Feb. 1962, page 43, FIG. 1, Dynaquad, TK- 7800- S59.

*Primary Examiner*—Rudolph V. Rolinec
*Assistant Examiner*—David M. Carter
*Attorney*—Robert D. Sanborn

[57] ABSTRACT

A momentary contact touch switch operates an electronic latching circuit which applies a constant direct current to a potentiometer. The potentiometer arm produces a controlled output voltage suitable for the remote electronic control of circuits having voltage sensitive variable capacitor tuning elements. A plurality of such devices operate as a touch-button tuning control with the potentiometers acting as the tuning controls to preset the touch-buttons. The voltage outputs of the potentiometers are fed through isolating diodes to a common control voltage output line so that only the potentiometer that is energized will be electrically connected to the output. All of the latching circuits are connected to a common element so that when any one circuit is actuated by a touch button, all of the others are deenergized.

5 Claims, 2 Drawing Figures

PATENTED OCT 17 1972 3,699,359

INVENTOR.
RUFUS F. SHELBY
BY Gail W. Woodward
AGENT

ELECTRONIC LATCHING DEVICE

BACKGROUND OF THE INVENTION

The potential advantages of using voltage variable reactances in electronic tuning systems have long been recognized but only recently have fabrication techniques been developed to where suitable devices can be reproducably made on a large-scale low-cost basis. Semiconductor diodes have a voltage variable capacitor (VVC) characteristic. These diodes provide reasonable capacitance values that can be varied over a wide range by merely changing the magnitude of an applied reverse bias voltage. They are very small, unaffected by mechanical vibration, require very little control power, and perform well at high frequencies. Now that cost problems are being solved usage is expanding rapidly. One of the most attractive properties of such diodes is their ability to be connected physically very close to the electrical elements which are to be tuned. Tuning control is then accomplished by applying to the VVC diode, by way of a connecting wire, a variable d-c voltage that is developed at any location, adjacent or remote. Thus the mechanical tuning function can be separated physically from the electrical tuning function to give the circuit designer much greater freedom in parts layout.

For a more complete discussion of the nature of VVC diodes, reference may be made to an article titled RECEIVER TUNING USING VARIABLE CAPACITANCE DIODES by L. W. Read and L. A. Weldon in the November 1963 issue of *IEEE Transactions on Broadcast and Television Receivers* starting on page 27.

While semiconductor diodes are the preferred voltage sensitive element, any suitable device can be used. For example electrostrictive capacitors can be used where relatively small changes in capacitance are acceptable. Variable inductance elements could be used and variable reactance electronic circuits are also suitable.

Television receiver tuners, particularly the UHF tuners, benefit greatly from the separation of the electrical and mechanical tuning functions. Freedom in styling is greatly enhanced and Federal Regulations on the comparability of VHF and UHF tuning are more readily met. Typically the tuning mechanism will be operated through a bank of pushbuttons. Each push button connects a potentiometer to a source of voltage and to the tuner. The potentiometer can be preset to provide the desired tuning voltage. Thus the pushbuttons and adjustments (potentiometers) do not have to be physically close to the tuner.

Mechanical pushbutton switches ordinarily employ a mechanical latching device that holds a button in a depressed condition until another button is depressed, whereupon the formerly pressed button is released and the newly depressed button latched. Each button actuates a set of switch contacts that can be arranged to provide the required electrical switching functions. Such devices are subject to considerably mechanical wear, are noisy and require substantial effort and motion to engage. Furthermore the electrical contacts generate electrical noise and tend to become intermittent with prolonged use.

Much of the shortcomings of pushbutton switches can be overcome by using touch buttons or momentary-contact switches that are quiet, require little effort, and are subject to little wear. The latching and connection functions are accomplished with an electronic circuit. Electrical relays with latching electrical contact connections have been used to permit the use of touch button actuators but these are expensive, subject to many of the problems of ordinary switches, bulky, and somewhat noisy. Static relays, the electrical counterpart of conventional relays but having no moving parts, have proven to be very useful in switching functions. They waste little power, have no contact problems, are silent in operation and can be made very small. For background, reference may be had to the book titled *Static Relays for Electronic Circuits* edited by R. F. Blake and published by Engineering Publishers, 1961.

SUMMARY OF THE INVENTION

It is an object of the present invention to provide an electronic latching circuit that can be used in plural form with touch-button switches selectively to provide any one of a plurality of adjustable d-c voltage levels.

It is a further object to achieve the latching function with complementary solid state devices that dissipate very little energy.

It is a still further object to employ solid state latching circuits in a touch-button system for selecting a preset voltage for adjusting, through the agency of a voltage variable reactance device the frequency of a tuned radio frequency circuit.

These and other objects are achieved by employing a bank of touch-button momentary contact switches to operate a plurality of electronic latching circuits, one for each switch. The preferred circuit employs an NPN and a PNP transistor in a back to back configuration that has two stable states. In the "on" state, each transistor conducts and holds the other transistor in a conductive condition. In the "off" state, bias voltages hold both transistors in the cut off condition so that neither device conducts. The output element in each latching circuit is a potentiometer. When the circuit is in the "on" state a source of regulated d-c voltage is applied to the potentiometer. In the "off" state the potentiometer is disconnected or isolated so that no voltage appears across it. The arm of each potentiometer, one for each switch, is connected to a common output line through a diode poled to conduct when the potentiometer arm is at a potential greater than that present on the output line. Thus a single circuit in the group that is in the "on" state will be connected to the output line while all "off" circuits will be disconnected by means of a reverse biased diode.

Each latching circuit has a common connection to all of the others for the purpose of turning the latch off. When any one circuit is energized by a touch button, a voltage is generated by the "on" transistors that will turn all other circuits off. This imposes a condition ensuring that only the latching circuit associated with the energized touch button will remain on.

DESCRIPTION OF THE PREFERRED PRACTICE OF THE INVENTION

Figure 1:
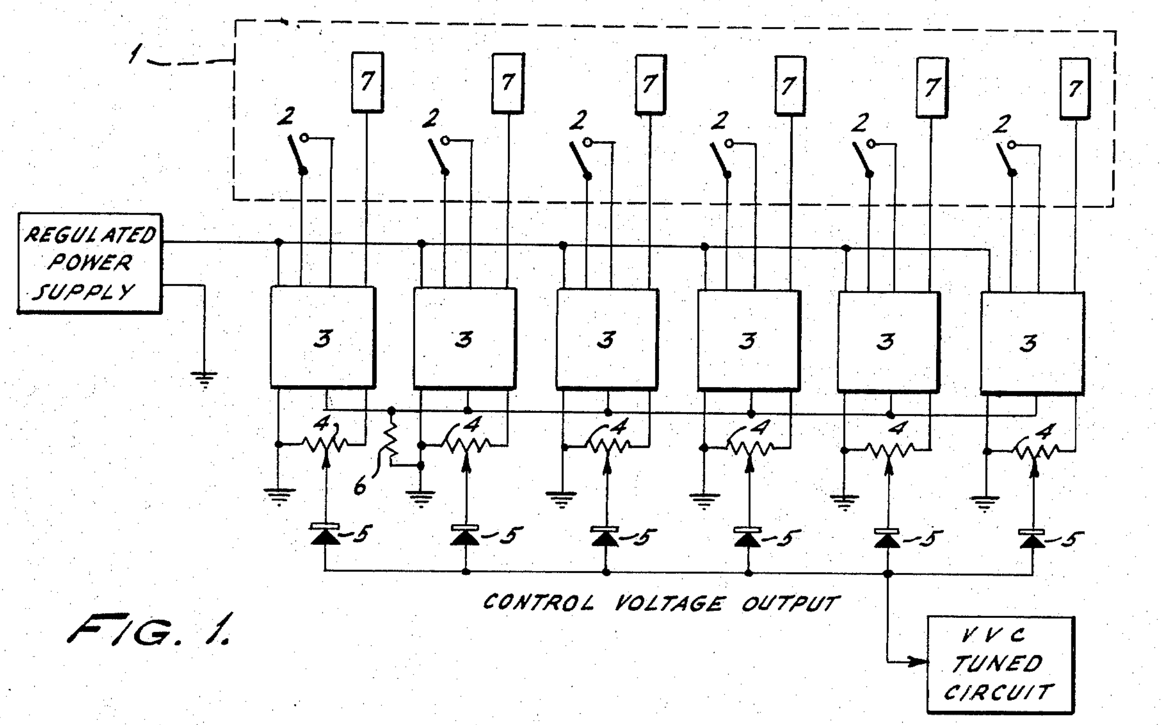
FIG. 1 is a partial schematic block diagram of the electronic latching device.

In FIG. 1 a panel assembly 1 contains a row of touch button switches 2 and indicating devices 7. In the interest of economy the indicating devices 7 could be omitted but where some sort of indicator is desired a conventional lamp may be employed. Alternatively indicator 7 could be an electroluminescent diode or even a numeral display device. While the indicators 7 are shown as being associated with the touch buttons they could be separate in the form of a remote display. A regulated power supply of conventional design supplies a constant d-c voltage to the system.

The touch buttons are simple momentary contact spring return switches. However they could be of a more complex design such as those switches that rely on body capacity or signal pickup, or an electro optical device can be used to detect the proximity of a hand or finger. These latter switch types can be actuated either by touch or proximity. Another suitable switch type is magnetically actuated. The touch button moves a small magnet that operates a sealed-reed-type switch. While any switch type can be used regardless of the mode of operation its ultimate action is that of a single-pole single throw normally-open switch. The following discussion will refer only to the basic type.

Associated with each touch button is an electronic latching circuit 3 having a potentiometer 4 as its output device. An isolation diode 5 connects the adjustable arm of each potentiometer to a control voltage output line that will be connected to a voltage variable capacitor used to control the frequency of a tuned circuit.

In the case of a television tuner three circuits such as the local oscillator, the r-f amplifier and the converter, each with its own voltage variable capacitor, might be tuned simultaneously by a single voltage source.

All of the latching circuits are interconnected by common resistor 6. When a touch button is depressed, the associated latching circuit is turned on. The function of resistor 6 is to cause all other latching circuits to be turned off, in a manner to be described with reference to FIG. 2, so that only the one actuated circuit remains on.

The isolation diodes 5 are so poled that any energized potentiometer is connected to the common control voltage output line whereas the diodes associated with deenergized potentiometers are back biased and effectively open circuits.

The energized potentiometer serves as a manually-operated tuning element for the controlled tuned circuits. It can be used as a knob-operated tuning element directly, or it can be preset so the system will operate as does a conventional push button system.

Figure 2:
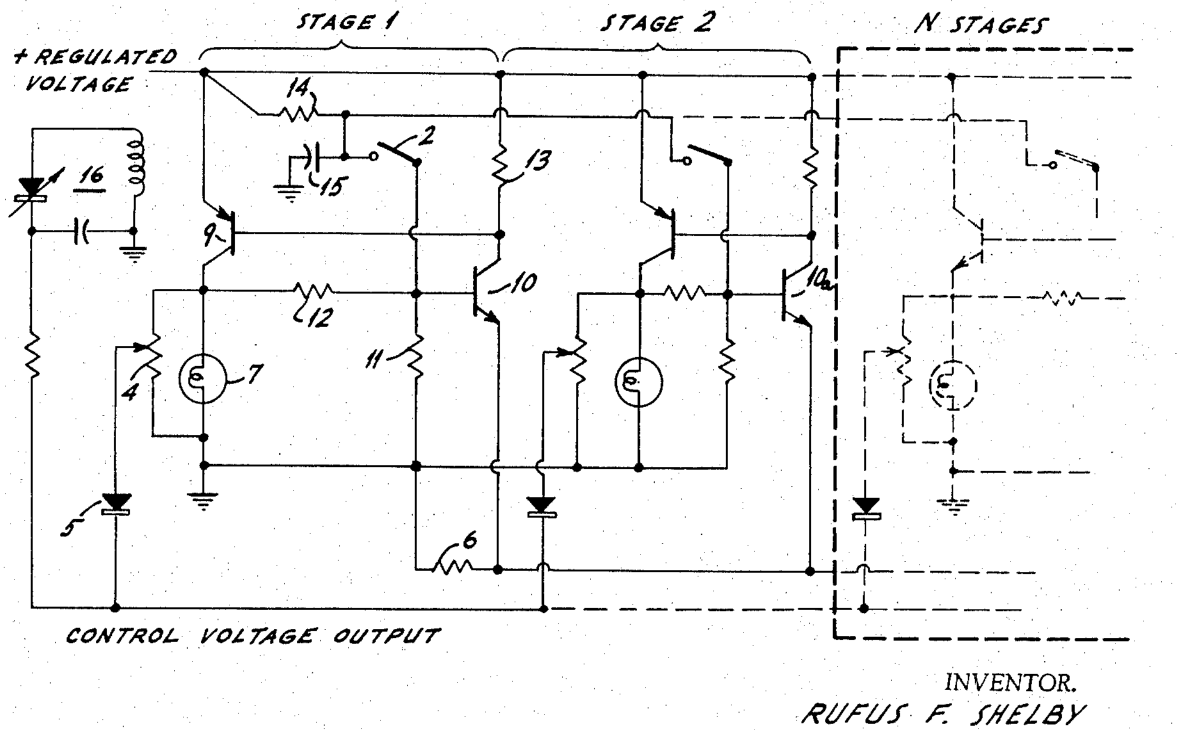
FIG. 2 is a schematic diagram showing the preferred electronic latching circuit.

In FIG. 2, two interconnected latching stages are shown, but, as indicated by the dotted lines, any number can be used. The circuits are powered by a regulated power supply to stabilize the r-f tuning characteristics. Regulation avoids problems of line voltage change and variable load conditions causing changes in tuning.

In stage 1 complementary transistors are shown. A PNP transistor 9 and an NPN transistor 10 are connected back to back to create a latching circuit. When touch button switch 2 is depressed capacitor 15, which has previously charged to the full value of regulated voltage through resistor 14, is connected to the base of transistor 10. This action turns transistor 10 on strongly and causes current to flow through resistor 13 producing an emitter-base voltage on transistor 9 that will turn it on. This action causes the regulated voltage to be applied to the shunt combination of potentiometer 4 and lamp 7, reduced only by the small saturation voltage drop across transistor 9. The voltage developed across the said shunt combination is coupled to the base of transistor 10. The proportion of coupling resistors 11 and 12 is selected so that transistor 10 will remain on even through capacitor 15 becomes discharged, or even if touch button switch 2 is allowed to open. Thus once the transistors 9 and 10 are turned on, the latching circuit will keep them on and potentiometer 4 will provide a source of variable d-c voltage for VVC tuning.

Stage 1, as well as any other on stage, can be turned off by interrupting the power source as by turning the equipment off. Alternatively the actuation of any other touch button will also turn the stage off. If for example stage 1 is on and stage 2 energized, the automatic turn off of stage 1 is effectuated as follows. When the touch button of stage 2 is actuated and the associated NPN transistor 10*a* turned on strongly, a voltage develops across resistor 6 that has a polarity that will turn transistor 10 off. It is only necessary that the voltage developed across resistor 6 when stage 2 is turned on be great enough to overcome the voltage across resistor 11 that holds transistor 10 on. Once transistor 10 is turned off the voltage across resistor 13 holding transistor 9 on disappears, thereby causing transistor 9 to stop conducting. This causes the bias applied to transistor 10, by way of resistors 11 and 12, to disappear so as to leave both transistors 9 and 10 off.

The following list of components constitutes a set of values that result in circuit performance as described above:

| | |
|---|---|
| + Regulated supply | 28 volts |
| Transistor 9 | PNP silicon 2N3906 |
| Transistor 10 | NPN silicon 2N3904 |
| Diode 5 | Silicon planar diode FD-100 |
| Potentiometer 4 | 50 k ohms |
| Resistor 6 | 220 ohms |
| Lamp 7 | 28 volts 40 ma. type 1819 |
| Resistor 11 | 15 k ohms |
| Resistor 12 | 27 k ohms |
| Resistor 13 | 1 k ohms |
| Resistor 14 | 68 k ohms |
| Capacitor 15 | .01 microfarad |

While the above described circuit is preferred, numerous modifications may be employed within the scope of the invention. For example, lamp 7 can be incorporated onto other circuit locations. The lamp 7 could be replaced by an electro-mechanical indicator or an electroluminescent diode or diode array with a suitable current limiting resistor. Also other forms of latching static relays could be used.

I claim:

1. A switching circuit for use with a radio frequency tuner employing a voltage variable reactance tuning element, including a plurality of means for supplying an adjustable voltage to said voltage variable reactance so that said tuner can be adjusted to any one of a plurality of frequencies at will by actuating one of a plurality of momentary contact switches, said circuit comprising:

a. a source of regulated direct current;

b. a plurality of electronic latching circuits, each latching circuit containing a momentary contact push button switch, a potentiometer, and active circuit elements connected to provide two stable electrical states, an "on" state wherein said potentiometer is connected through said active circuit element to said source of regulated direct current, and an "off" state wherein said potentiometer is isolated from said source of regulated direct current, said on state being actuated by said switch;

c. means common to said plurality of electronic latching circuits and responsive to the actuation to the "on" state of a selected one of said latching circuits for actuating the "off" state in non-selected latching circuits; and d. means for connecting said potentiometers to a common output line while isolating from said common output line all potentiometers associated with a latching circuit in the "off" state.

2. The switching circuit of claim 1 including means for indicating which latching circuit is in the "on" state.

3. The switching circuit of claim 1 wherein said active circuit elements comprises a pair of complementary transistors.

4. The switching circuit of claim 1 wherein said means for connecting comprises a semiconductor diode for each electronic latching circuit.

5. The switching circuit of claim 2 wherein said means for indicating comprises lamp elements connected in parallel with said potentiometers.

* * * * *